United States Patent
Mount

Patent Number: 5,159,277
Date of Patent: Oct. 27, 1992

[54] PRECISION BRIDGE CIRCUIT USING A TEMPERATURE SENSOR

[75] Inventor: Bruce E. Mount, Diamond Bar, Calif.

[73] Assignee: The Perkin Elmer Corporation, Norwalk, Conn.

[21] Appl. No.: 602,537

[22] Filed: Oct. 24, 1990

[51] Int. Cl.⁵ .......................................... G01R 27/02
[52] U.S. Cl. .................................... 324/721; 324/706; 324/720; 324/725; 324/101; 307/491
[58] Field of Search ............... 324/705, 706, 720, 721, 324/725, 101; 307/491

[56] References Cited

U.S. PATENT DOCUMENTS

| | | | |
|---|---|---|---|
| 3,568,044 | 3/1971 | Elazar | 324/720 X |
| 4,169,243 | 9/1979 | Payne et al. | 324/720 X |
| 4,229,692 | 10/1980 | Graeme | 324/706 X |
| 4,717,811 | 1/1988 | Fujii | 324/721 X |
| 5,030,849 | 7/1991 | Brokaw | 307/491 X |

Primary Examiner—Jack B. Harvey
Assistant Examiner—Glenn W. Brown
Attorney, Agent, or Firm—Joseph R. Dwyer; Thomas P. Murphy; Edwin T. Grimes

[57] ABSTRACT

A precision bridge measurement circuit connected to a current source providing a linear output voltage versus resistance change of a variable resistance (resistance temperature transducer) including a voltage follower in one branch of the bridge so that the zero setting of the transducer resistance does not depend upon the current source or upon an excitation voltage. The zero setting depends only on the precision and stability of the three resistances. By connecting the output of an instrumentation amplifier to a feedback resistor and then to the output of the voltage follower, minor nonlinearities in the resistance-vs-temperature output of a resistance-temperature transducer, such as a platinum temperature sensor, may be corrected. Sensors which have nonlinearity opposite in polarity to platinum, such as nickel-iron sensors, may be linearized by inserting an inverting amplifier into the feedback loop.

11 Claims, 3 Drawing Sheets

PRECISION BRIDGE CIRCUIT USING A TEMPERATURE SENSOR

GOVERNMENT RIGHTS

The invention described herein was made in the performance of work under NASA Contract No. NAS8-50000 and is subject to the provisions of Section 305 of the National Aeronautics and Space Act of 1958 (42 U.S.C. 2457).

BACKGROUND OF THE INVENTION

This invention is an improvement in bridge measurement circuits which provides such circuits with a linear output when used with single-arm resistance-type transducers and also to provide linear output of nonlinear resistance-type transducers when desired.

FIG. 1 shows a conventional Wheatstone bridge circuit commonly used for measurement of resistance changes in a single arm, resistance-type transducer (RTD), such as a platinum resistance thermometer The bridge has an excitation voltage source V connected at node 1 to a first branch of the bridge which comprises two series connected resistances, resistance $R_A$ and transducer resistance $R_B$ (RTD) with resistance $R_B$ connected to ground at node 2. Voltage V is also connected at node 1 to a second branch of the bridge to two series connected resistances $R_C$ and $R_D$ With resistance $R_D$ being connected at node 2 to ground. The output signal voltage $e_o$ of the bridge is taken at node 8 ($e_a$) between resistance $R_A$ and transducer resistance $R_B$ and between resistances $R_C$ and $R_D$ at node 4 ($e_b$). The output signal voltage is amplified by output operational amplifier AR. A change in output signal voltage $e_o$ of the bridge circuit is a nonlinear function of the change in the resistance of transducer resistance $R_B$. As shown in the calculations in Appendix 1, (1), only when the resistance of $R_A$ is much larger than the resistance of $R_B$ does the relationship approach linearity. However, the larger the resistance of $R_A$ becomes, the smaller the output signal voltage $e_o$ becomes. Therefore, a compromise must be made between linearity and output signal amplitude.

To overcome the problem of nonlinearity and small output signal, a modification to the bridge circuit can be made which is shown in FIG. 2.

In FIG. 2, node i is omitted and, for the first branch of the bridge, a current source i replaces resistance $R_A$ such that the current source i develops a voltage drop across transducer resistance $R_B$. For the second branch of the bridge, a voltage source V is connected in series with resistance $R_C$ and resistance $R_D$ and resistance $R_D$ is connected to ground as in FIG. 1 except that resistance $R_C$ is variable. Again, output signal voltage $e_o$ is taken at node 8 ($e_a$) between current source i and transducer resistance $R_B$ and at node 4 ($e_b$) between resistances $R_C$ and $R_D$. Output signal voltage $e_o$ is amplified by output operational amplifier AR. Variable resistance $R_C$ and resistance $R_D$ form a voltage divider for zero adjustment of the amplifier AR.

When the current source i is used to develop a voltage across the transducer resistance $R_B$, and resistance $R_C$ is adjusted for output voltage signal $e_o$ to be equal to zero when the transducer resistance $R_B$ is at a zero setting, then a change in output signal $e_o$ versus the change in resistance in transducer resistance $R_B$ will be linear The disadvantage in the circuit of FIG. 2 is (1) a zero adjustment is required, and (2) the zero adjustment will not remain stable if either the current source i or the excitation voltage V were to change. Therefore, both the current source i and the voltage source V would have to be highly regulated to maintain the stability of the zero setting.

It is therefore an object of this invention to provide a bridge measurement circuit in which the zero setting does not depend on a current source or an excitation voltage and to provide a linear output from the bridge circuit when a single arm resistance-type transducer, such as a platinum temperature sensor, is used in the circuit.

Another object of this invention is to provide a simple way to linearize minor nonlinearities in the output of resistance-temperature transducers, such as that of a platinum temperature sensor.

SUMMARY OF THE INVENTION

The precision bridge measurement circuit of this invention is connected to a current source and comprises a first branch including a first resistance and a transducer resistance connected in series and to ground and a second branch including a voltage follower and two resistances all connected in series and to ground. The output signal voltage is taken from between the first resistance and transducer resistance and from between the two resistances of the second branch which is amplified by a output instrumentation (or differential) amplifier. With the voltage gain of the voltage follower equal to unity and with high current gain, by selecting the first resistance equal to the resistance of the transducer resistance at zero setting (typically at 0 degrees centigrade for an RTD), and by selecting the two resistances in the second branch to be equal, the zero setting of the transducer resistance does not depend upon the current source or upon an excitation voltage. The zero setting depends only on the precision and stability of the three resistances.

By connecting the output of the voltage follower and feeding the output of the instrumentation amplifier to a feedback resistor and then to the input of the voltage follower, minor nonlinearities in the resistance-vs-temperature output of a resistance-temperature transducer, such as a platinum temperature sensor, may be corrected. Sensors which have nonlinearity opposite in polarity to platinum, such as nickel-iron sensors, may be linearized by inserting an inverting amplifier into the feedback loop.

DETAILED DESCRIPTION

Figure 3:
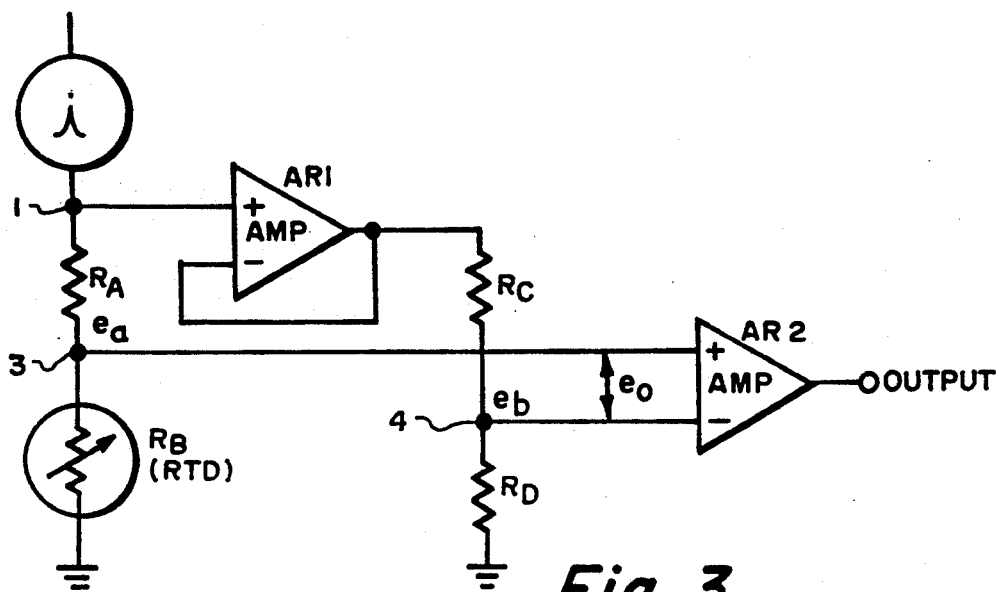
FIG. 3 is a bridge measurement circuit having the resistance-type transducer device which circuit is constructed in accordance with the teachings of this invention.

FIG. 3 illustrates the precision bridge measurement circuit constructed in accordance with this invention.

A current source i is connected at node 1 to a first branch of the bridge comprising resistances $R_A$ connected in series with transducer resistance $R_B$. Transducer resistance $R_B$ is connected to ground. The second branch of the bridge is connected at node 1 and comprises an operational amplifier AR1 connected as a voltage follower with unity voltage gain and high current impedance whose output is connected in series with resistance $R_C$ and resistance $R_D$. Resistance $R_D$ is connected to ground. Node 1 is connected to the non-inverting input of amplifier AR1 and the output of the amplifier AR1 is fed back to the non-inverting input of amplifier AR1 to form the voltage follower. The output of the bridge, $e_o$, is taken from node 3 ($e_a$) between resistance $R_A$ and transducer resistance $R_B$ and node 4 ($e_b$) located between resistance $R_C$ and resistance $R_D$. The voltage output signal $e_o$ is amplified by output instrumentation amplifier AR2.

In this circuit, the output voltage signal $e_o$ is a linear function of the resistance change in transducer resistance $R_B$. As seen in the Appendix I, (2), if the offset voltage of the operational amplifier AR1 is negligible, resistance $R_A$ is equal to the value of transducer resistance $R_B$ at the zero reference point, and the resistance of resistance $R_C$ is equal to the resistance of resistance $R_D$, then the output voltage of the bridge $e_o$ will be zero at the zero reference point of the transducer resistance $R_B$. Furthermore, if the current source i drifts slightly, no change in the zero setting will result. Also, the zero setting of the transducer resistance $R_B$ does not depend on the current source or an excitation voltage but depends only on the precision and stability of the three resistances $R_A$, $R_C$ and $R_D$.

The extremely high current gain of the operational amplifier AR1 means that for all practical purposes there is no current drain on current source i yet the same voltage is maintained across resistances $R_C$ and $R_D$ as across resistances $R_A$ and $R_A$. The offset voltage of operational amplifier AR1 is low, in the order of less than 1 millivolt. For example, an operational amplifier PMI OPO7 of Precision Monolithic Inc, has an offset voltage typically of 50 to 100 microvolts maximum and is available for this purpose.

To understand the operation of the bridge circuit of this invention, consider this bridge circuit without the voltage follower; the current through resistance $R_B$ is unknown because some of the current is shared with resistances $R_C$ and $R_D$. This means that the current cannot be maintained constant through resistance $R_B$ because, with an increase in temperature, the resistance of $R_B$ increases the voltage across resistances $R_A$ and $R_B$. The main effect of the increase in resistance of resistance $R_B$ is to reduce the current through resistance $R_B$ because some of the current is shared by resistances $R_C$ and $R_D$. If resistances $R_A$ and $R_B$ increase, more current will go through resistances $R_C$ and $R_D$. This is undesirable because, for a linear voltage vs temperature at node 3, the current should stay as it was before the temperature of resistance $R_B$ increased.

Thus, to prevent any current from the current source i going through resistances $R_C$ and $R_D$, the voltage follower AR1 is used. Thus, as the resistance of resistance $R_B$ increases with temperature, the voltage changes proportionately because the current through resistances $R_A$ and $R_B$ remains constant.

Figure 4:
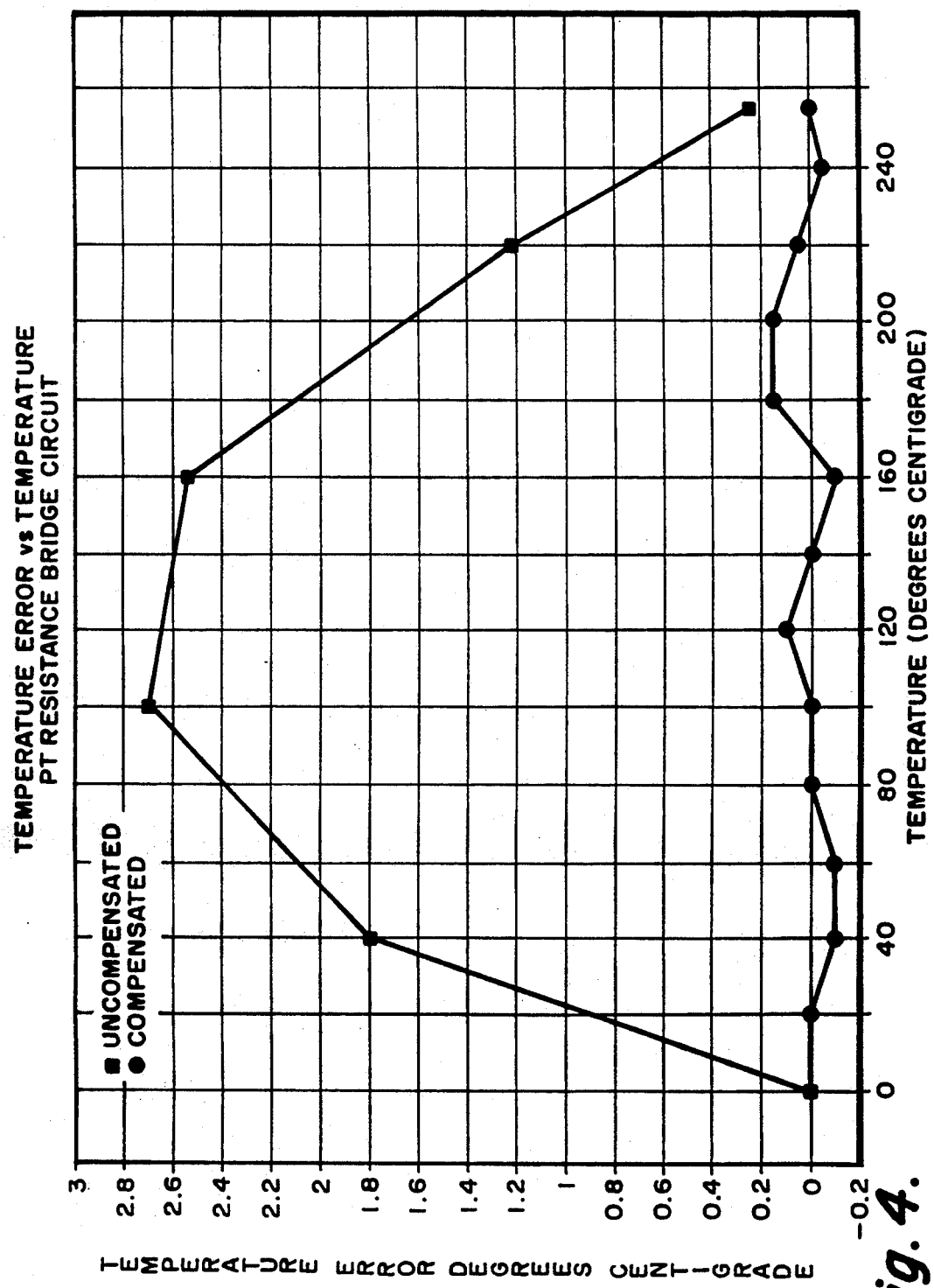
FIG. 4 is a graph of temperature error versus temperature showing the nonlinearity of a platinum type resistance in a bridge circuit before compensation and after compensation.
Figure 5:
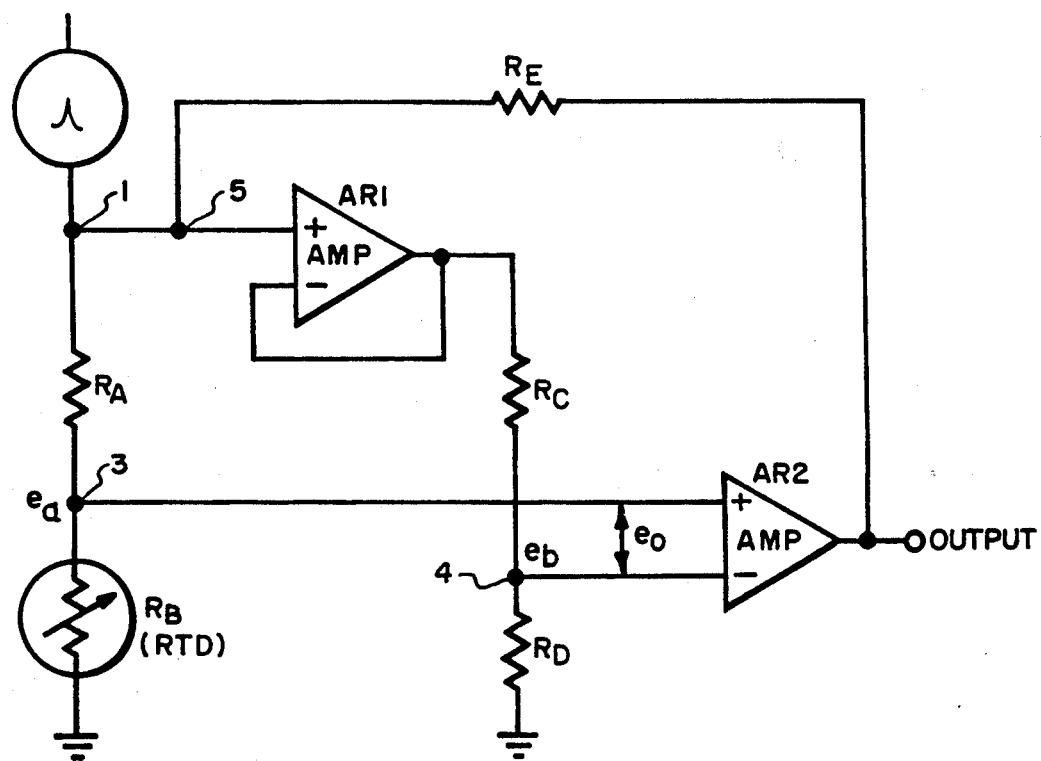
FIG. 5 is the circuit of FIG. 8 having means for providing linearity to the output of a resistance-temperature transducer.

The circuit of FIG. 3 provides a linear voltage output versus resistance. One difficulty is that real sensors do not change resistance linearly with temperature. This nonlinearity is shown in FIG. 4 by the curve marked "uncompensated". Thus the linear output in the bridge circuit of FIG. 3 will not provide linear voltage output versus temperature using a platinum resistance thermometer device. To provide temperature output linearity, an opposite and equal nonlinearity effect must be produced to compensate for the nonlinearity of the temperature output of the platinum.

FIG. 4 illustrates the nonlinearity compensating means of this invention. The circuit of FIG. 4 is the same as shown in FIG. 3 except that the output of the output amplifier AR2 is fed back through a feedback resistance $R_E$ to the non-inverting input of amplifier AR1 to cause a nonlinear change in the current supplied to resistances $R_A$ and $R_B$ which compensates for the nonlinearity in resistance $R_B$. This simple addition of the one resistance $R_E$ in the circuit provides a linearization of nonlinear resistance-type transducers, such as platinum temperature sensors. The resistance value of the feedback resistance $R_E$ will vary according to the measure of nonlinearity of the platinum resistance $R_B$.

Figure 6:
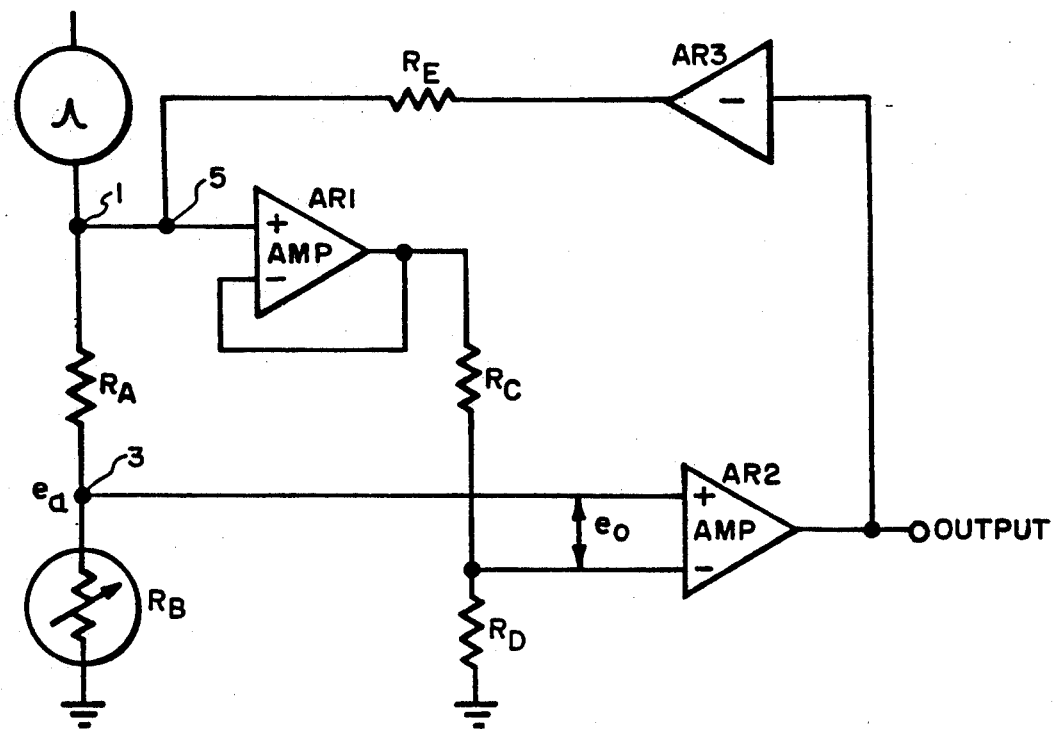
FIG. 6 is the same circuit as that of FIG. 5 but with an inverting amplifier at the output of the circuit.

FIG. 6 is a circuit identical with that of FIG. 4 with an inverting operational amplifier AR3 coupled to the output of the output amplifier AR2 and its output is fed back through a feedback resistance $R_E$ to the non-inverting input of the output amplifier AR2 where an inverted output signal is required. This circuit compensates for those sensors which are of a polarity opposite to the platinum sensors, such as nickel-iron sensors and the polarity of the amplifier AR3 and the resistance value of the feedback resistance $R_E$ will vary according to the measure of the nonlinearity of the non-platinum type sensors.

APPENDIX I

1. Wheatstone Bridge

Figure 1:
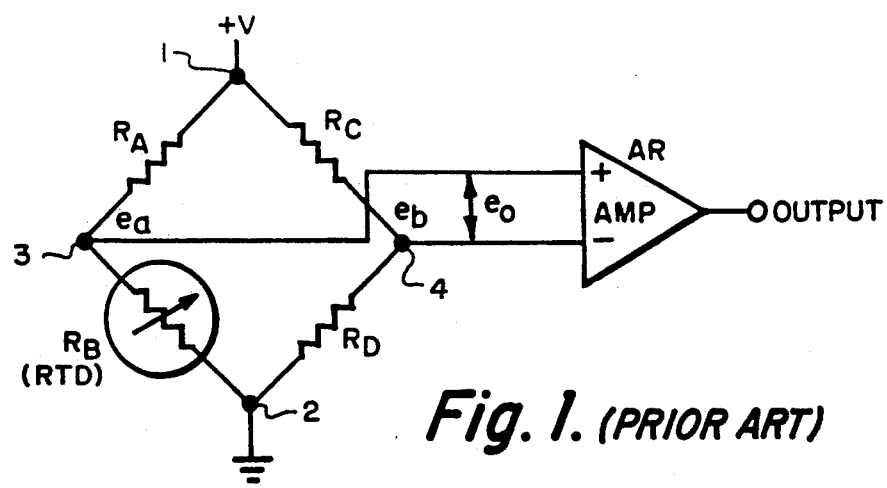
FIG. 1 is a prior art Wheatstone bridge measurement circuit for a resistance-type transducer device.

From FIG. 1, $$e_a = V \frac{R_B}{(R_A + R_B)}, \tag{1}$$

$$e_b = V \frac{R_D}{(R_C + R_D)} \tag{2}$$

But, $$e_o = e_a - e_b \tag{3}$$

Substituting (1) & (2) into (3) we obtain, $$e_o = V \left[ \frac{R_B}{(R_A + R_B)} - \frac{R_D}{R_C + R_D} \right] \tag{4}$$

We wish to find the variation in $e_o$ as $R_B$ changes ($R_A$, $R_C$, and $R_D$ are constants). Differentiating (4) with respect to $R_B$, we obtain, $$\frac{de_o}{dR_B} = V \left[ \frac{R_A + R_B - R_B}{(R_A + R_B)^2} \right]$$

or, $$\frac{de_o}{dR_B} = \frac{VR_A}{(R_A + R_B)^2} \tag{5}$$

Rewriting (5) we have, $$de_o = \left[\frac{VR_A}{(R_A + R_B)^2}\right]dR_B \tag{6}$$

Therefore, the variation of $e_o$ as $R_B$ varies is not a linear function.

Expanding the denominator of (6) we obtain, $$de_o = \left[\frac{VR_A}{(R_A^2 + 2R_AR_B + R_B^2)}\right]dR_B \tag{7}$$

If $R_A >> R_B$, (7) becomes, $$de_o \approx \frac{V}{R_A} dR_B \tag{8}$$

which is a linear relation.

As $R_A$ is increased, the nonlinearity decreases. However, $de_o$ also decreases as $R_A$ increases. Therefore, to obtain an approximately linear output, the output signal must greatly decrease, requiring more amplification.

2. Linear Bridge

Figure 2:
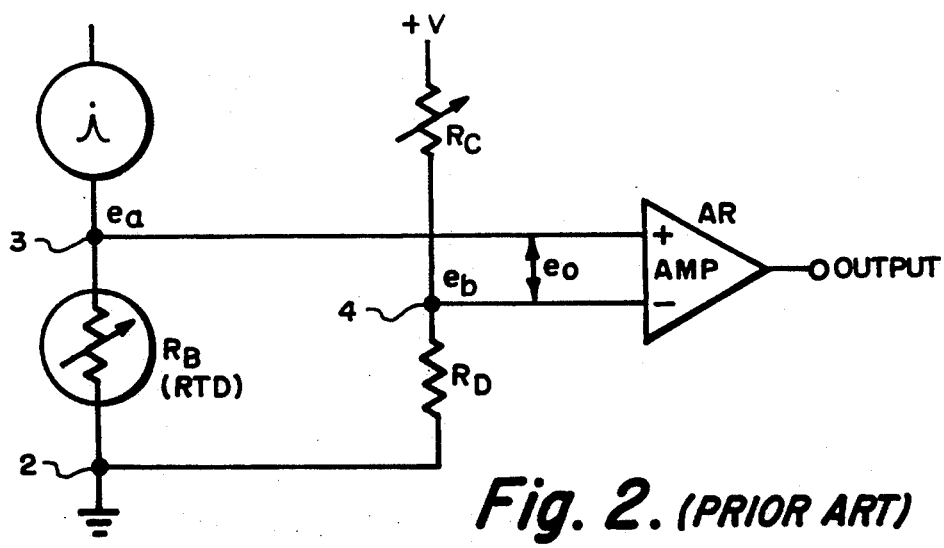
FIG. 2 is a prior art bridge measurement circuit having a current source to provide the voltage drop across the resistance-type transducer device.

From FIG. 2, $$e_a = iR_B, \tag{1}$$

$$e_b = i\frac{(R_A + R_B)R_D}{(R_C + R_D)} \tag{2}$$

Letting $R_C = R_D$, (2) becomes, $$e_b = i\frac{(R_A + R_B)}{2} \tag{3}$$

also, from FIG. 1, $$e_o = e_a - e_b \tag{4}$$

Substituting (1) and (3) into (4) we obtain, $$e_o = i\left[R_B - \frac{(R_A + R_B)}{2}\right] = i\frac{(2R_B - R_A - R_B)}{2}$$

or, $$e_o = i\frac{(R_B - R_A)}{2} \tag{5}$$

We wish to find the variation in $e_o$ with respect to $R_B$. Differentiating (5) with respect to $R_B$ we obtain, $$\frac{de_o}{dR_B} = \frac{i}{2} \tag{6}$$

Let $$\frac{i}{2} = k \tag{7}$$

Equation (6) becomes, $$de_o = k\,dR_B \tag{8}$$

which is a linear relation.

I claim:

1. A precision bridge measurement circuit connected to a current source comprising,
   a first branch connected to said current source and including a first resistance and a transducer resistance connected in series and to ground, and
   a second branch connected to said current source and including a voltage follower and two resistances all connected in series and to ground, said voltage follower being connected between said current source and said two resistances,
   the output signal voltage of said bridge being taken from between the first resistance and said transducer resistance and from between said two resistances of said second branch.

2. The circuit as claimed in claim 1 further including output means for amplifying the output signal voltage of said bridge.

3. The circuit as claimed in claim 2 further including means for compensating for the nonlinearity of temperature versus change in resistance of said transducer resistance.

4. The circuit as claimed in claim 3 wherein said compensating means comprises a feedback resistance coupled between the output of said output means for amplifying the output signal voltage and the input of said voltage follower.

5. The circuit as claimed in claim 4 further including an inverting amplifier connected between the output of said output means for amplifying the output signal voltage and said feedback resistance.

6. A precision bridge circuit connected to a current source comprising:
   a first node,
   a first branch connected to said first node and including a first resistance and a transducer resistance connected in series, said transducer resistance being connected directly to ground,
   a second node between said first resistance and said transducer resistance,
   a second branch connected to said first node and including a voltage follower, a third resistance connected to the output of said voltage follower and a fourth resistance connected to the third resistance, all connected in series and directly to ground,
   a third node between said third and fourth resistances,
   the output signal of said bridge being taken from said second node and said third node.

7. The circuit as claimed in claim 6 further including an output amplifier for amplifying the output signal of said bridge.

8. The circuit as claimed in claim 6 further including means for compensating for the nonlinearity of said temperature versus change in resistance of said transducer resistance and including a feedback resistance coupled between the output of said output amplifier and the input of said voltage follower.

9. The circuit as claimed in claim 8 further including an inverting amplifier connected between the output of said output amplifier and said feedback resistance.

10. A precision bridge measurement circuit connected to a current source comprising,
   a first branch connected to said current source and including a first resistance and a transducer resistance connected in series and to ground, and
   a second branch connected to said current source and including two resistances connected in series and to ground and a current isolation means connected between said current source and said two resistance,
   the output signal of said bridge being taken from between the first resistance and said transducer resistance and from between said two resistances of said second branch,
   said bridge being initially balanced with said transducer resistance at zero and wherein any increase in said transducer resistance and attendant change in current in said first branch is isolated from said second branch by said current isolation means.

11. A precision bridge measurement circuit connected to a current source comprising,
   a first branch connected to said current source and including a first resistance and a transducer resistance connected in series and to ground,
   a second branch connected to said current source and including two resistances connected in series and to ground and a current isolation means between said current source and said two resistances, and
   the output signal of said bridge being taken from between said first resistance and said transducer resistance and from between said two resistances of said second branch,
   said bridge being initially balanced at zero and wherein any variation in current flow due to current source drift will not affect the circuit output zero reference.

* * * * *

UNITED STATES PATENT AND TRADEMARK OFFICE
CERTIFICATE OF CORRECTION

PATENT NO. : 5,159,277
DATED : October 27, 1992
INVENTOR(S) : Bruce E. Mount

It is certified that error appears in the above-identified patent and that said Letters Patent is hereby corrected as shown below:

Column 1, line 30, delete "8" and insert --3--

Column 1, line 37, delete "1" and insert --I--

Column 1, line 47, delete "i" and insert --1--

Column 1, line 55, delete "8" and insert --3--

Column 2, line 66, delete "8" and insert --3--

Signed and Sealed this

Fifth Day of October, 1993

BRUCE LEHMAN

Attest:

Attesting Officer

Commissioner of Patents and Trademarks